(12) United States Patent
Zhu et al.

(10) Patent No.: US 7,387,871 B2
(45) Date of Patent: Jun. 17, 2008

(54) MASK COMPLEMENTARY MULTIPLE EXPOSURE TECHNIQUE

(75) Inventors: Jianxin Zhu, Eagan, MN (US); Lance Eugene Stover, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 553 days.

(21) Appl. No.: 10/927,564

(22) Filed: Aug. 26, 2004

(65) Prior Publication Data

US 2006/0046210 A1 Mar. 2, 2006

(51) Int. Cl.
*G03F 7/20* (2006.01)

(52) U.S. Cl. .................. 430/322; 430/5; 430/397; 430/394; 430/313

(58) Field of Classification Search .............. 430/5, 430/397, 394, 313
See application file for complete search history.

(56) References Cited

U.S. PATENT DOCUMENTS

| | | | |
|---|---|---|---|
| 5,285,517 A | | 2/1994 | Wu |
| 5,407,785 A | * | 4/1995 | Leroux ............ 430/312 |
| 5,636,004 A | | 6/1997 | Ootaka et al. |
| 5,753,417 A | * | 5/1998 | Ulrich ............. 430/312 |
| 5,973,771 A | * | 10/1999 | Hibbs et al. ........... 356/121 |
| 6,346,979 B1 | | 2/2002 | Ausschnitt et al. |
| 6,406,834 B1 | * | 6/2002 | Kuit et al. ........... 430/311 |
| 6,525,909 B1 | | 2/2003 | Qian et al. |
| 6,608,735 B1 | | 8/2003 | Serpe et al. |
| 2001/0033979 A1 | * | 10/2001 | Baggenstoss .......... 430/5 |
| 2001/0041306 A1 | * | 11/2001 | Cole et al. ........... 430/312 |
| 2002/0123012 A1 | * | 9/2002 | Sewell .............. 430/397 |
| 2002/0182547 A1 | * | 12/2002 | Raguin .............. 430/322 |
| 2003/0044724 A1 | * | 3/2003 | Van Itallie et al. ....... 430/313 |
| 2003/0165749 A1 | | 9/2003 | Fritze et al. |
| 2005/0196687 A1 | * | 9/2005 | Huang et al. ............ 430/5 |

FOREIGN PATENT DOCUMENTS

| | | |
|---|---|---|
| EP | 0 969 327 A2 | 1/2000 |
| EP | 0 969 327 A3 | 10/2002 |
| WO | WO 03/079111 A1 | 9/2003 |

OTHER PUBLICATIONS

Patent Application of Lanshi Zheng et al.; Disc Head Slider Having Vertically Contoured Features And Method Of Fabricating Vertically Contoured Features On A Slider; S01.12-0669/STL 9596 (29 pgs.).

(Continued)

*Primary Examiner*—Mark F. Huff
*Assistant Examiner*—Caleen O Sullivan
(74) *Attorney, Agent, or Firm*—Kinney & Lange, P.A.

(57) ABSTRACT

A method for creating a pattern on an exposure site of a material blank using an exposure apparatus includes providing a mask having a first mask pattern. The mask is positioned between the exposure apparatus and the material blank. The exposure site of the material blank is exposed. One or more additional exposure events are performed for patterning the exposure site of the material blank. Between each exposure event, the exposure site of the material blank is repositioned in a lateral direction with respect to the mask. Between successive exposure events involving the first mask pattern, there is a relative movement between the mask and the material blank of a distance less than or equal to a length of the first mask pattern.

21 Claims, 6 Drawing Sheets

OTHER PUBLICATIONS

Fabrication And Properties Of Refractive Micro Optical Beam Shaping Elements; E. Bernhard Kley et al.; Fraunhofer Institute of Applied Optics and Precision Engineering, Schillerstr. 1,07745 Jena, Germany; SPIE vol. 3879 (pp. 20-25).

Effects of Certain Design Parameters On Load/Unload Performance; Qing-Hua Zeng and David B. Bogy; IEEE Transactions On Magnetics, vol. 36, No. 1, Jan. 2000 (pp. 140-147).

Micro-optic Fabrication Using One-Level Gray-Tone Lithography; K. Reimer, H.J. Quenzer, M. Jürss, B. Wagner; Fraunhofer Institute Silicon Technology (ISIT); Department of Microsystemtechnology; SPIE vol. 3008 (pp. 279-288).

General Aspheric Refractive Micro-optics Fabricated By Optical Lithography Using A High Energy Beam Sensitive Glass Gray-Level Mask; Walter Däschner, Pin Long and Robert Stein; Chuck Wu—Canyon Materials Inc., S.H. Lee—Department of Electrical and Computer Engineering, University of California San Diego, La Jolla; J. Vac. Sci. Technol. B 14(6), Nov./Dec. 1996; (pp. 3730-3733).

* cited by examiner

MASK COMPLEMENTARY MULTIPLE EXPOSURE TECHNIQUE

BACKGROUND OF THE INVENTION

The present invention relates to a method of forming features on a material blank. More particularly, the present invention relates to a method of forming features on a material blank using multiple exposure events.

Photolithography is a technique commonly used for the creation of three dimensional structures on a material blank, such as a substrate wafer, a semiconductor chip, a display device, a detecting device, or image pickup device, for example. The photolithography process generally allows features such as rails, grooves, ridges, tapers or gradients, and other features to be formed on a material blank that begins the photolithography process as one or more substantially flat layers.

Photolithography is often used in the formation of features on a slider for a transducer head apparatus. It may be desired to create tapered corners along the perimeter of the slider, at an air bearing surface (ABS). In addition, it may be desired to create three dimensional formations along an advanced air bearing surface (AABS), such as an AABS located in an interior portion of the slider. Such tapered features are desirable in addressing shock and contact, and also for providing secondary pressurization. Shock includes both operational-shock (i.e., shock occurring while the slider is in use) and non-operational-shock (i.e., shock occurring while the slider is not in use, such as during transportation). Contact is particularly a concern with load-unload disc drive systems, where a slider frequently comes in contact with a medium, such as a textured portion of a disc. Three dimensional features formed on a slider can help mitigate negative effects due to contact between the slider and an adjacent storage medium (e.g., a disc), as well as provide additional air lift force. A slider ABS having patterned, three-dimensional gradient or tapered features has been shown to have better fly capabilities and low-energy contact performance than a convention slider ABS.

In a typical slider fabrication process, individual sliders are initially formed as part of a large wafer that contains numerous individual sliders that are connected together. Photolithography for forming three-dimensional ABS and AABS features on individual sliders is typically conducted at wafer-level manufacturing. At a later point, individual sliders are separated from the wafer.

Generally, photolithography involves the use of a mask placed between an exposure apparatus and a material blank, such as a substrate wafer. The mask includes one or more patterns that are imaged on the material blank by exposing the mask and material blank with the exposure apparatus.

Numerous types of exposure apparatuses are available. For example, 1× steppers are known which produce a pattern on a material blank of the same scale as a pattern on the mask. Also known are reduction steppers that produce patterns on the material blank at a different, generally smaller, scale than the pattern on the mask (e.g., a 4× stepper).

The mask (e.g., a photomask) has at least one mask pattern thereupon. The mask is disposed between the material blank and the exposure apparatus during the exposure process. A typical mask is comprised of chrome and glass, where chrome is applied to the glass to prevent the transmission of light through discrete portions of the mask. Portions of the mask not made opaque by chrome typically allow transmission of some light through the glass to the material blank.

The first step in a photolithography process involves surface preparation, where a surface of the material blank is cleaned and dried. The purpose of cleaning the material blank is to remove any contamination on the surface of the material blank, such as dust, organic, ionic and metallic compounds. The cleaned material blank may be primed to aid adhesion of a photoresist to the surface of the material blank.

Next, a photoresist is applied to the material blank. The photoresist is a thin layer of light-sensitive material that is applied to a surface of the material blank where features will be formed. The photoresist is applied to the material blank at some early stage of the photolithography process, but is typically removed at some later point. A variety of positive and negative photoresist materials are available, and the particular photoresist used is selected according to the particular requirements of a specific application. The photoresist layer is typically applied to the surface of the material blank using a coating apparatus, such as a spin-coating machine, which applies the photoresist in a vacuum.

After the photoresist is applied, a softbake process may be used to promote partial evaporation of photoresist solvents and promote adhesion of the photoresist to the material blank.

Next, after the photoresist is applied and adhered to the material blank (and any softbake processes are conducted), an alignment process is conducted. During alignment, the material blank is precisely aligned relative the mask. The initial alignment is critical, and is conducted in X and Y directions, as well as rotationally. Positioning of the material blank and the exposure apparatus relative the mask will vary according to the type of exposure apparatus used. Types of exposure apparatuses include contact, proximity, and projection exposure machines.

After alignment, an exposure process is conducted where portions of the photoresist layer on the material blank are exposed according to the particular pattern sought to be formed on the material blank. During the exposure process, portions of the photoresist undergo a chemical reaction when illuminated, such as with ultraviolet (UV) light, by the exposure apparatus. Exposure of the mask positioned relative the material blank causes a pattern on the mask to be transmitted to the photoresist layer on the material blank. During the exposure process, portions of the photoresist are typically polymerized according to the desired pattern. In conventional photolithography, a single exposure event transfers all the illumination energy needed to image the desired pattern on the material blank.

In some photolithography systems, a mask includes multiple mask patterns. For example, a single mask may include a rough cut mask pattern and a fine cut mask pattern. During the exposure process, different mask patterns may be used to expose a single exposure site on the material blank (i.e, a discrete region on the material blank within which a distinct pattern is desired to be formed) with different mask patterns, or the same mask pattern may be used to expose different exposure sites on a large material blank. These processes typically involve initiating large-scale lateral movements of the mask, with such large-scale movements typically being of distances greater than a length or width of the mask patterns on the mask.

After the exposure process, a development process is typically conducted, where polymerized photoresist can be hardened and unpolymerized photoresist can be removed, through processes such as a postbake process and the application of a stripping solution.

At this point in the photolithography process, a three dimensional pattern is typically formed on the photoresist layer of the material blank. This transient three-dimensional pattern on the photoresist layer is not necessarily identical to the pattern desired to be finally formed on the material blank. The three-dimensional pattern formed on the photoresist layer is a protective layer of varying depths, with the depth and shape of the three-dimensional pattern on the photoresist varying as a function of the amount of protections desired for particular areas of the material blank.

Next, an etching process is conducted. During the etching process, portions of the material blank itself are removed. The etching process may be conducted using ion milling with charged ions, such as Argon plasma ($Ar^+$), and sometimes along with other chemistry to assist the process. In addition, other techniques known in the art can be utilized. With techniques such as ion milling, the material blank, partially covered by protective photoresist material, is bombarded by ions, which erode or sputter away portions of the material blank. During the etching process, depth and shape of portions of the material blank removed will vary as a function of the three-dimensional pattern formed in the photoresist layer. Typically, areas of the material blank not protected (i.e., not covered) by photoresist material will be etched to a greater depth on the material blank. Accordingly, areas of the material blank protected by greater amounts (i.e, a thicker portion) of the photoresist will be etched to lesser depths of the material blank, if at all. In general, the etching process will depend on the particular materials and factors involved, such as photoresist responsiveness. During the etching process, the material blank may be rotated in order to achieve optimal results, as will be recognized by those skilled in the art.

After the material blank has been sufficiently etched, a final step involves removal of any remaining photoresist material.

In addition, various inspections of the material blank are typically conducted throughout the photolithography process.

Halftone (and grayscale, etc.) masks are a type of mask commonly used with photolithography processes for forming three-dimensional patterns on an air bearing surface (ABS) of a slider. Halftone masks use an array or grid of individual mask units. Individual mask units have a particular transmission intensity level, meaning that a particular percentage of illumination energy is resolved when transmitted through the individual mask units. The array of mask units forms regions with discrete transmission levels. By selecting the location and transmission levels of mask units in the array, a desired mask pattern is created for imaging the particular pattern on a material blank. However, halftone mask photolithography systems, particularly with 1× steppers, often do not permit enough of a gradual change in the transmittance level of the mask to produce smooth or relatively smooth features on the material blank.

High reduction-ratio steppers (e.g., 4× or 5× steppers) can utilize many transmission intensity levels, but such high reduction-ratio steppers are costly. In slider ABS fabrication, 1× steppers are most common due to high throughput and low cost-of-ownership benefits. However, using conventional photolithography techniques, 1× steppers typically do not provide enough transmission intensity levels to form desired features on a slider ABS. More particularly, conventional photolithography using 1× steppers does not produce features having desired smoothness characteristics.

Another type of mask is a high energy beam-sensitive (HEBS) glass mask. HEBS masks allow for gradual changes in the light transmittance properties of the mask, thereby allowing smoother and more detailed features to be formed than with traditional halftone masks. However, HEBS systems are very costly, and are often not compatible with photolithography equipment currently in use in labs and manufacturing facilities for forming ABS features on a slider.

A reflow method can be used to form three-dimensional features. Reflow methods typically involve applying a ductile ball of material to a desired location, and then heating that ball such that the ductile material flows enough to reshape it. However, reflow methods have little design flexibility except for spherical patterns. Thus, reflow methods are not particularly amenable to slider ABS fabrication.

The present invention relates to an alternative method for forming features on a material blank.

BRIEF SUMMARY OF THE INVENTION

The present invention relates to an exposure method for creating a pattern on an exposure site of a material blank using an exposure apparatus, the method includes providing a mask having a first mask pattern. The mask is positioned between the exposure apparatus and the material blank. The exposure site of the material blank is exposed. One or more additional exposure events are performed for patterning the exposure site of the material blank. Between each exposure event, the exposure site of the material blank is repositioned in a lateral direction with respect to the mask. Between successive exposure events involving the first mask pattern, there is a relative movement between the mask and the material blank of a distance less than or equal to a length of the first mask pattern.

An optional smoothing event may also be conducted. For example, a method of trimming undesired features on a material blank, which has a previously-exposed photoresist layer, includes positioning a trim mask relative the patterned material blank and exposing the trim mask. Exposure of the trim mask reduces a total area of raised features on the material blank.

DETAILED DESCRIPTION

The present invention relates to an exposure method for creating a pattern on an exposure site of a material blank using an exposure apparatus, the method includes providing a mask having a first mask pattern. The mask is positioned between the exposure apparatus and the material blank. The exposure site of the material blank is exposed. One or more additional exposure events are performed for patterning the exposure site of the material blank. Between each exposure event, the exposure site of the material blank moves in a lateral direction with respect to the mask. Between individual exposures of the first mask pattern on the mask, the material blank moves relative the mask a distance less than or equal to a length of the first mask pattern on the mask. The mask can include one or more mask patterns.

Figure 1:
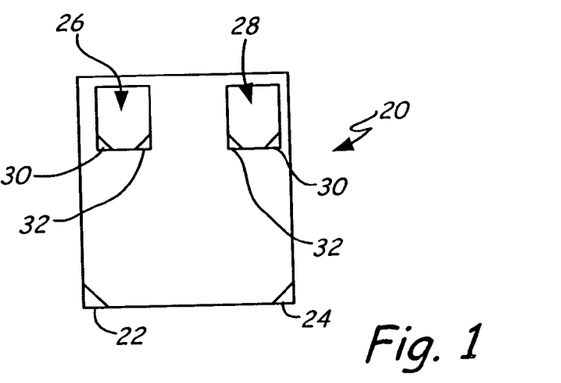
FIG. 1 is an exemplary representation of an air bearing surface (ABS) of a slider.

It is often desired to form an object, such as a slider capable of use with a disc drive system, with three-dimensional features. FIG. 1 is an exemplary representation of an air bearing surface (ABS) of a slider 20. The slider 20 includes a pair of tapered or gradient corner features 22 and 24. Further included on the slider 20 are first and second advanced air bearing surface (AABS) features 26 and 28, each having a pair of tapered corner features 30 and 32.

The slider 20 represents a pattern desired to be formed by photolithography techniques. However, the slider 20 depicted in FIG. 1 is exemplary, and other slider designs having different features and different configurations of features are possible, as will be obvious to those having skill in the art.

FIGS. 2A-2E are exemplary mask units for use with photolithography. A halftone mask has an array or grid of individual mask units, where the mask units include a number of sub-resolution features. The minimum array pitch ($P_{min}$) is defined by the following equation, where "NA" is a numeric aperture of a stepper projection lens, "$\sigma$" is a partial coherence of the stepper lens, and "$\lambda$" is an illumination wavelength:

$$P_{min} = \frac{NA}{(1+\sigma)\lambda}$$

Features smaller than $P_{min}$ (i.e., the threshold pitch) will generally not be resolved during an exposure process.

Figures 2A, 2B:
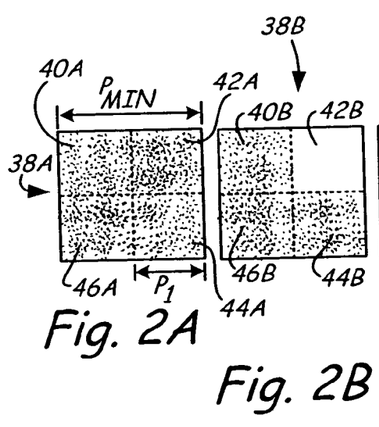
FIGS. 2A-2E show exemplary mask units.

FIG. 2A depicts an example of a 2×2 mask unit 38A having a first sub-resolution feature quadrant 40A, a second sub-resolution feature quadrant 42A, a third sub-resolution feature quadrant 44A, and a fourth sub-resolution feature quadrant 46A. This arrangement can be extended to an n×n unit, where "n" is a positive integer and the smallest feature size that can be resolved on a corresponding mask is dictated by $P_{min}$ divided by n ($P_{min}/n$). The mask unit 38A has a width $P_{min}$ and the individual sub-resolution feature quadrants 40A, 42A, 44A, and 46A each have a width $P_1$. Typically, the mask unit 38 is arranged as a square. For instance, $P_{min}$ can be 1.2 micrometers (μm) while $P_1$ is 0.6 μm.

By halftoning individual mask units, different transmittance levels can be established for each mask unit according to a transmission level scheme. With a 2×2 mask unit, such as the mask units 38A-38E shown in FIGS. 2A-2E, five different transmittance levels are defined. Each sub-resolution feature is defined as substantially opaque or substantially transparent. Substantially opaque areas can be covered by a material such as chrome, while substantially transparent areas can be glass (e.g., quartz glass).

As shown in FIG. 2A, all of the sub-resolution feature quadrants 40A, 42A, 44A, and 46A of mask unit 38A are opaque. A transmittance level of the mask unit 38A is defined as zero, meaning that illumination energy is generally not transmitted through the mask unit 38A.

In FIG. 2B, the second sub-resolution feature quadrant 42B is transparent while first, third and fourth sub-resolutions feature quadrants 40B, 44B, and 46B are substantially opaque. The transmittance level of the mask unit 38B is defined as 25%, meaning that approximately 25% of the illumination energy applied to the mask unit is transmitted through the mask unit.

Figures 2C, 2D, 2E:
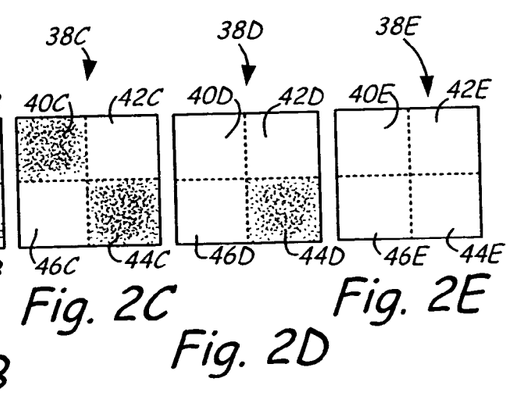

FIG. 2C depicts an mask unit having a transmittance level of 50%. The mask unit 38C has second and fourth sub-resolution quadrants 42C and 46C that are substantially transparent and first and third sub-resolution quadrants 40C and 44C that are substantially opaque.

An mask unit having a transmittance level of 75% is depicted in FIG. 2D, where the first, second and fourth sub-resolution quadrants 40D, 42D and 46D are substantially transparent, while a third sub-resolution quadrant 44D is substantially opaque.

FIG. 2E depicts an mask unit having a transmittance level of 100%. In FIG. 2E, the sub-resolution quadrants 40E-46E are all substantially transparent.

The particular arrangement of transparent and opaque sub-resolution quadrants can change. Because the sub-resolution features below the threshold pitch will not fully resolve on a material blank, the particular arrangement of substantially transparent and substantially opaque sub-resolution features within an mask unit can generally vary without significantly affecting results of mask.

Figure 3:
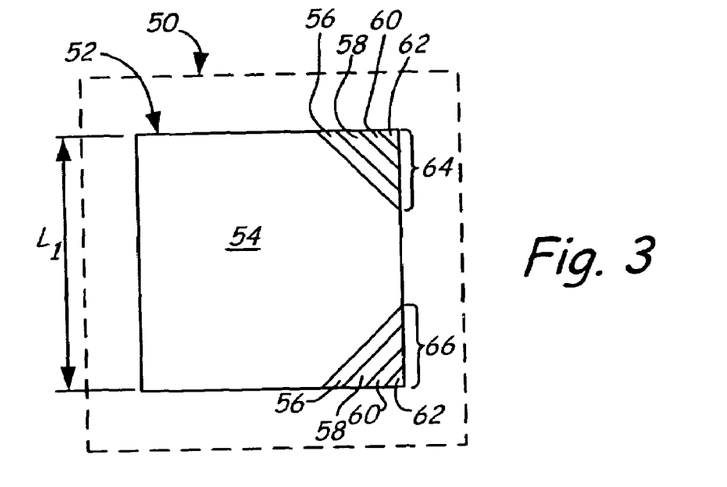
FIG. 3 is an exemplary representation of a first mask pattern located on a mask.

FIG. 3 is an exemplary representation of a mask 50 having a first reticle field or mask pattern 52. The mask pattern 52 has a first region 54, a second region 56, a third region 58, a fourth region 60, and a fifth region 62, each region having a particular transmittance level. The mask pattern 52 further includes gradient or taper regions 64 and 66. The mask pattern 52 has a length $L_1$, which is defined as a longest dimension of the mask pattern 52.

The mask 50 can be a halftone mask, where each of the regions 54, 56, 58, 60 and 62 comprises an array of mask units having similar or identical transmittance levels. For example, the first region 54 can have a transmittance level of zero, the second regions 56 can have a transmittance level of 25%, the third regions 58 can have a transmittance level of 50%, the fourth regions 60 can have a transmittance level of 75%, and the fifth regions 62 can have a transmittance level of 100%. The number and arrangement of discrete regions can vary, as can the particular levels of transmittance for each region. Moreover, the mask 50 can be of another type, such as a high energy beam-sensitive (HEBS) glass type mask and a standard binary type mask. A single mask can have more than one mask pattern thereon, and each mask pattern can differ in configuration and form.

For a halftone mask, each region is comprised of an array of individual mask units, such as those shown in FIGS. 2A-2E. For example, the second regions 56 can have a transmittance level of 25%. Individual mask units, each having a transmittance level of 25%, are arranged in a generally regular, grid-like like pattern throughout the second regions 56. Other regions of the mask pattern 52 include similar arrays of individual mask units.

Figure 4:
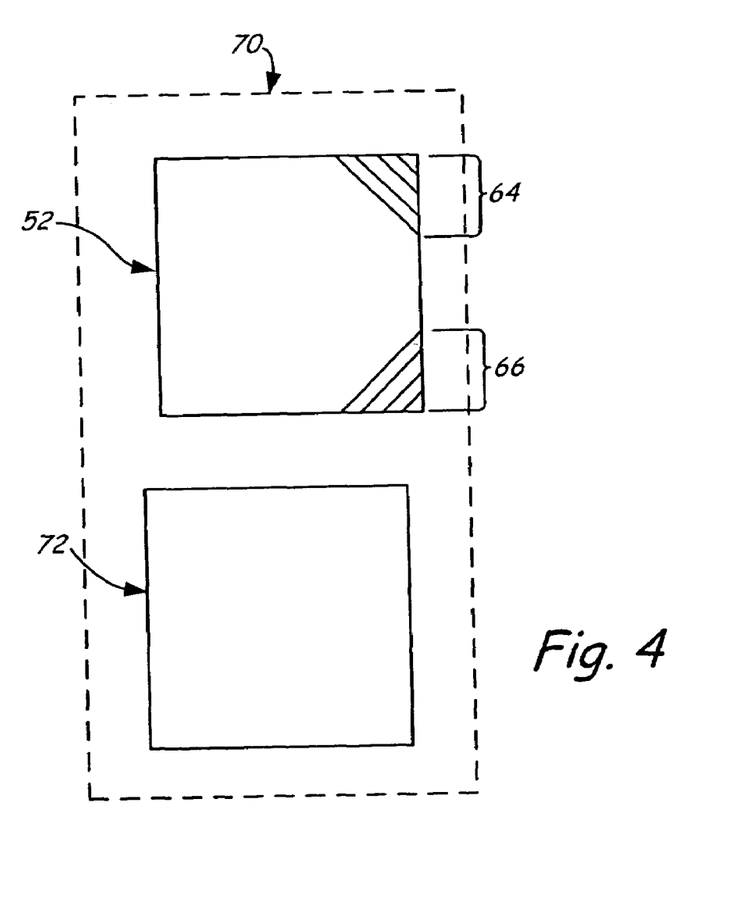
FIG. 4 is an exemplary representation of a mask having a first mask pattern and a second mask pattern.

FIG. 4 is an exemplary representation of a mask 70 including the first mask pattern 52 and a second mask pattern 72. The first mask pattern 52 shown in FIG. 4 includes the pair of taper regions 64 and 66, and the second mask pattern 72 can include patterning (not shown) different from the first mask pattern 52.

The first and second mask patterns 52 and 72 are disposed adjacent each other on a single mask (mask 70 ). Additional mask patterns can be included with the mask 70.

Figure 5:
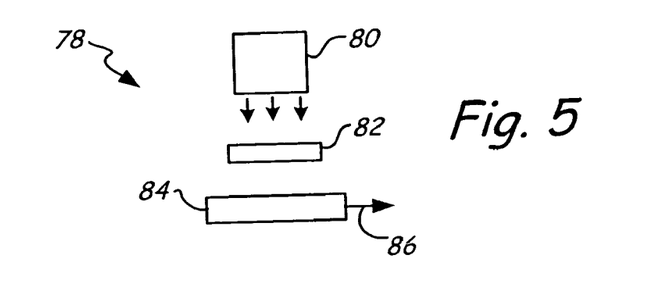
FIG. 5 is a schematic representation of a proximity photolithography system.

FIG. 5 is a schematic representation of a photolithography system 78, including an exposure apparatus 80, a mask 82, and a material blank 84. The photolithography system 78 is a proximity exposure system. Contact and projection exposure machines can also be utilized. In a preferred embodiment, the exposure apparatus 80 is a z×stepper (where "z" is an integer) and a stepper stage (not shown) allows positioning of the material blank 84 relative the mask 82.

The material blank 84 is, for example, a substrate wafer including a plurality of slider formations. As necessary during photolithography processes, the material blank 84 typically includes photoresist material. Prior to exposing the material blank 84 to an illumination energy source, a thin photoresist layer (not shown) is applied to a surface of the material blank 84 facing the exposure apparatus 80. As will be obvious to one skilled in the art, the photoresist layer comprises material sensitive to illumination energy.

The mask 82 is disposed between the exposure apparatus 80 and the material blank 84. The exposure apparatus 80 is capable of generating illumination energy for exposing the mask 82 to image a pattern on the material blank 84. The material blank 84 can be repositioned in a lateral direction relative to the mask 82, such as in a lateral direction 86. A lateral direction is any direction substantially in a plane in which the material blank 84 lies. Regardless of any relative movements between components of the photolithography system 78, alignment of the exposure apparatus 80 typically remains substantially perpendicular to the material blank 84. The mask 82 includes one or more mask patterns that are imaged on the material blank 84 by exposing the mask 82 and material blank 84 with illumination energy from the exposure apparatus 80.

Figure 6:
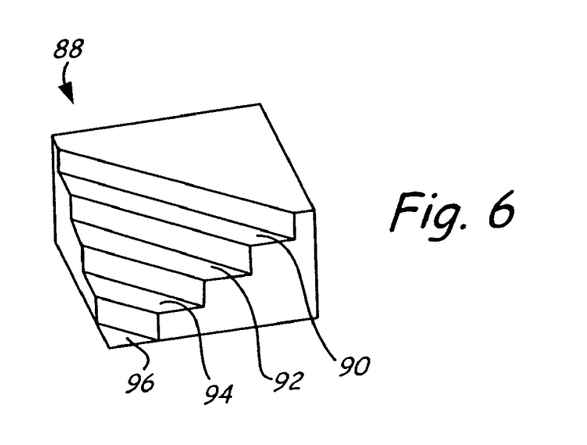
FIG. 6 is a perspective view of a portion of a material blank after a single exposure event.

FIG. 6 is a perspective view of a portion of a material blank 88 after a single exposure event. The material blank 88 includes a number of step-like formations 90, 92, 94 and 96. The step-like formations 90, 92, 94 and 96 generally correspond to regions of a mask pattern on a mask used during the exposure event. For example, the step-like formation 90 is formed by exposure of a mask pattern region having a first non-zero transmission level (e.g., second region 56 of the mask pattern 52 in FIG. 3) and the step-like formation 92 is formed by exposure of a mask pattern having a second non-zero transmission level (e.g., the third region 58 of the mask pattern 52 in FIG. 3). The particular characteristics of the system (e.g., whether a positive or negative photoresist is used) will determine how particular regions on a mask produce formations on a material blank (through exposure of a corresponding layer of photoresist material).

Generally, according to the present method, small-scale lateral movements of a material blank relative a mask are initiated between each exposure event in a series of exposure events. Lateral movement repositioning a material blank relative a mask is typically accomplished by moving the material blank using stepper stage motion control. In addition, relative movement between the material blank and the mask can be accomplished by moving the mask. Each individual exposure event of a multiple exposure (i.e., step-and-expose) process typically uses repeated exposures of a single mask pattern on a mask to image a pattern on an exposure site of a material blank. An exposure site is generally defined as a discrete region on a material blank exposed during a photolithography process, within which a distinct pattern is desired to be formed.

Figure 7:
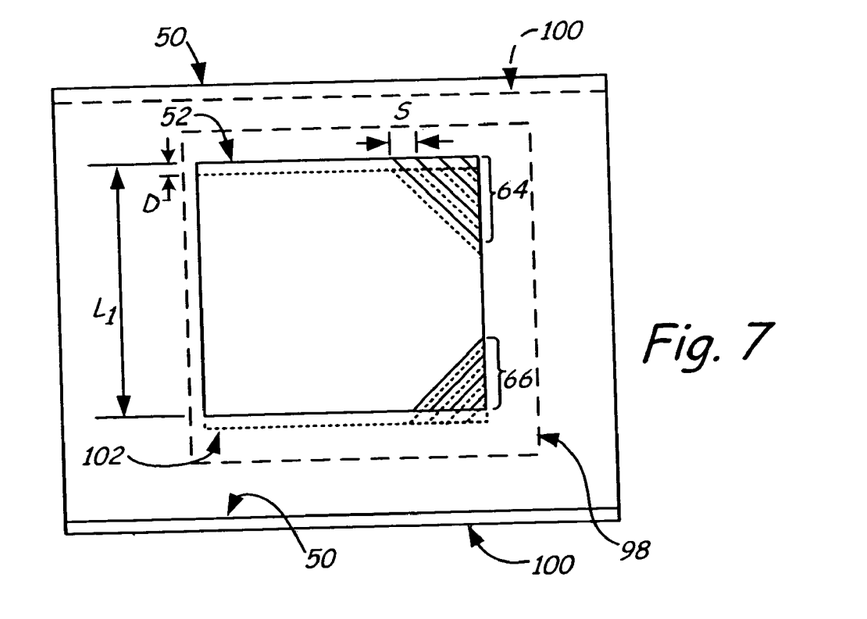
FIG. 7 is a schematic representation of the mask of FIG. 3 shown in multiple positions.

FIG. 7 is a schematic representation of the mask 50 of FIG. 3 shown relative an exposure site 98 of a once-exposed material blank 100. Between a first exposure and a second exposure of the step-and-expose process, the once-exposed material blank 100 moves relative the mask 50 a lateral distance D (e.g., by moving the material blank 100 with stepper stage motion control), such that the mask pattern 52 is offset from a first pattern 102 imaged on the exposure site 98 of the once-exposed material blank 100 by the distance D. The lateral distance D will vary according to the particular features desired to be formed within the exposure site 98. However, the distance D is typically a relatively small-scale movement less than the length $L_1$ of the mask pattern 52. For instance, where taper regions 64 and 66 include step-like mask regions each having a width S of about 80 micrometers (μm), the lateral distance D can be about 5 μm.

More than two movements can be utilized during the overall exposure process. Moreover, additional step-and-expose sequences can laterally move the material blank a constant or varying distance between exposure events, depending on the pattern desired.

Figure 8:
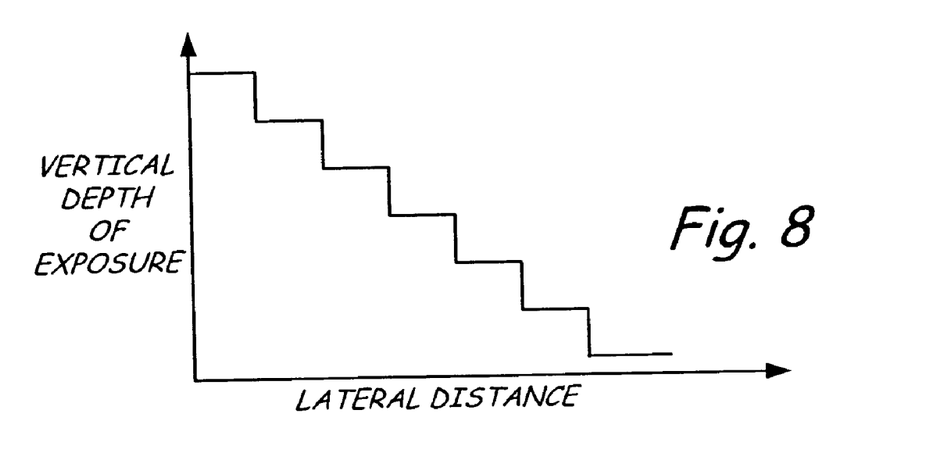
FIG. 8 is a graph depicting a profile of a material blank after a single exposure event.
Figure 9:
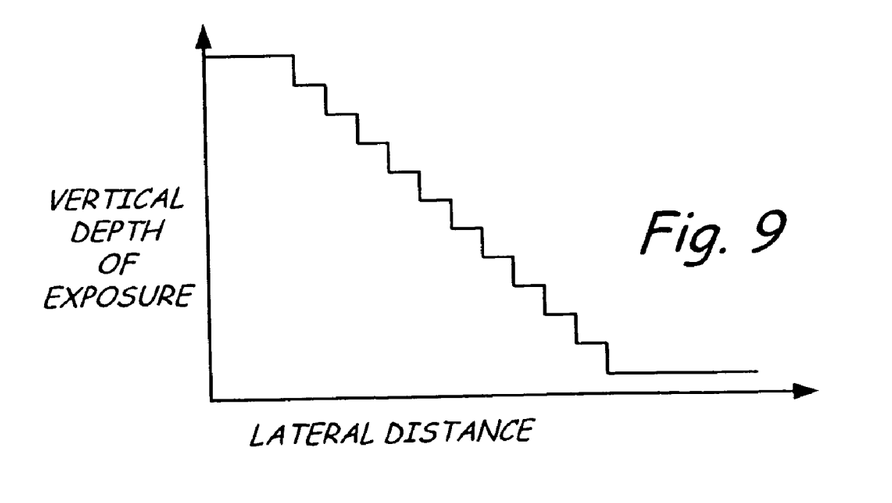
FIG. 9 is a graph depicting a profile of the material blank of FIG. 8 after a second exposure event.

FIGS. 8 and 9 are graphs depicting a profile of a material blank after each exposure of a multiple exposure event sequence, where a mask is moved laterally (such as shown in FIG. 7) between the exposure events. FIG. 8 is a graph depicting a profile of a material blank after a single exposure event. FIG. 9 is a graph depicting a profile of the material blank of FIG. 8 after a second exposure event.

Figure 10:
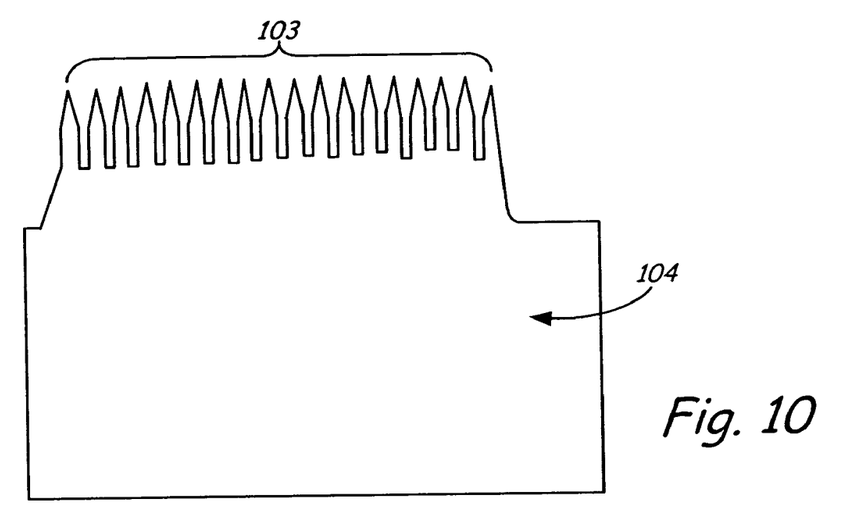
FIG. 10 is a schematic representation of features formed on a material blank prior to a smoothing event.

A smoothing event can be used to smooth patterns imaged on a material blank. FIG. 10 is a schematic representation of a feature 103 formed on a material blank 104 by photolithography techniques and prior to a smoothing event.

Figure 11:
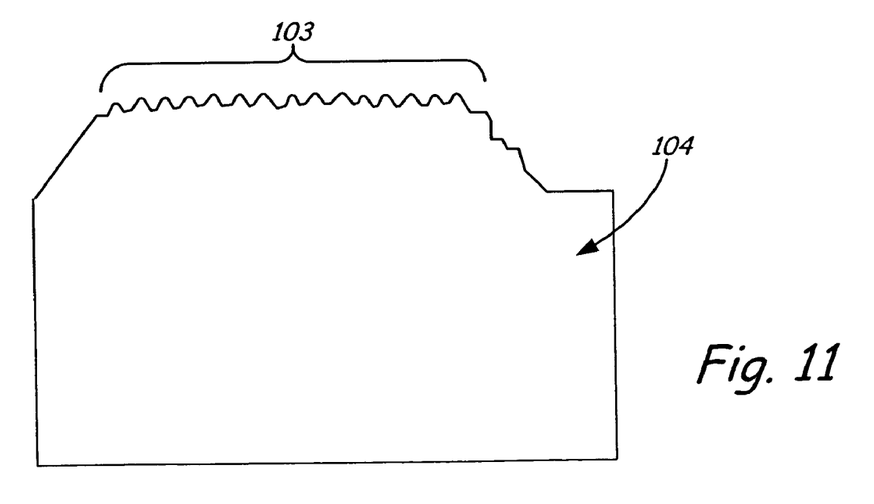
FIG. 11 is a schematic representation of the material blank of FIG. 10 after a smoothing event.

FIG. 11 is a schematic representation of the feature 103 of the material blank 104 of FIG. 10 after a smoothing event. The smoothing event generally improves the surface quality of the material blank during patterning. The smoothing event can include a defocus event. A defocus event is an exposure of a mask and material blank where the material blank is moved out of focus, typically by moving the material blank away from or towards the exposure apparatus so that a mask pattern on the mask does not fully resolve on the material blank during exposure. In other words, the material blank is generally moved out of a focal plane. For example, the material blank 104 can be moved 10 μm out of the focal plane. Intensity of illumination energy used with defocus events is comparable to that for exposure events of the step-and-expose process. Generally, the illumination energy level for a defocus event is within ten percent (10%) of an average energy level for exposure events conducted during the step-and-expose process.

Limits on defocus events include surface texture amplitude modulation (see, e.g., the feature 103 in FIG. 10), desired image quality of the desired pattern (see, e.g., the feature 103 in FIG. 11), movement permitted by a photolithography system (particularly, movement permitted by the exposure apparatus).

As another example, the smoothing event can be a post-bake (or flash-bake) event. The post-bake event involves the application of thermal energy to the material blank 104. Thermal energy is applied by contact or convection. Typically, thermal energy of the post-bake event is applied by a heating element to a side of the material blank 104 opposite a side of the material blank 104 where a photoresist layer is applied. Thermal energy from the post-bake event causes a smoothing effect along features on the material blank 104, such as along the feature 103. This post-bake process has a "wrinkle removing" effect due to surface tensions of the photoresist. The characteristics of the post bake event will be determined by the desired effects on the material blank, as will be obvious to those skilled in the art.

Multiple smoothing events can be utilized. For instance, defocus and post-bake smoothing events can both be used.

Figure 12:
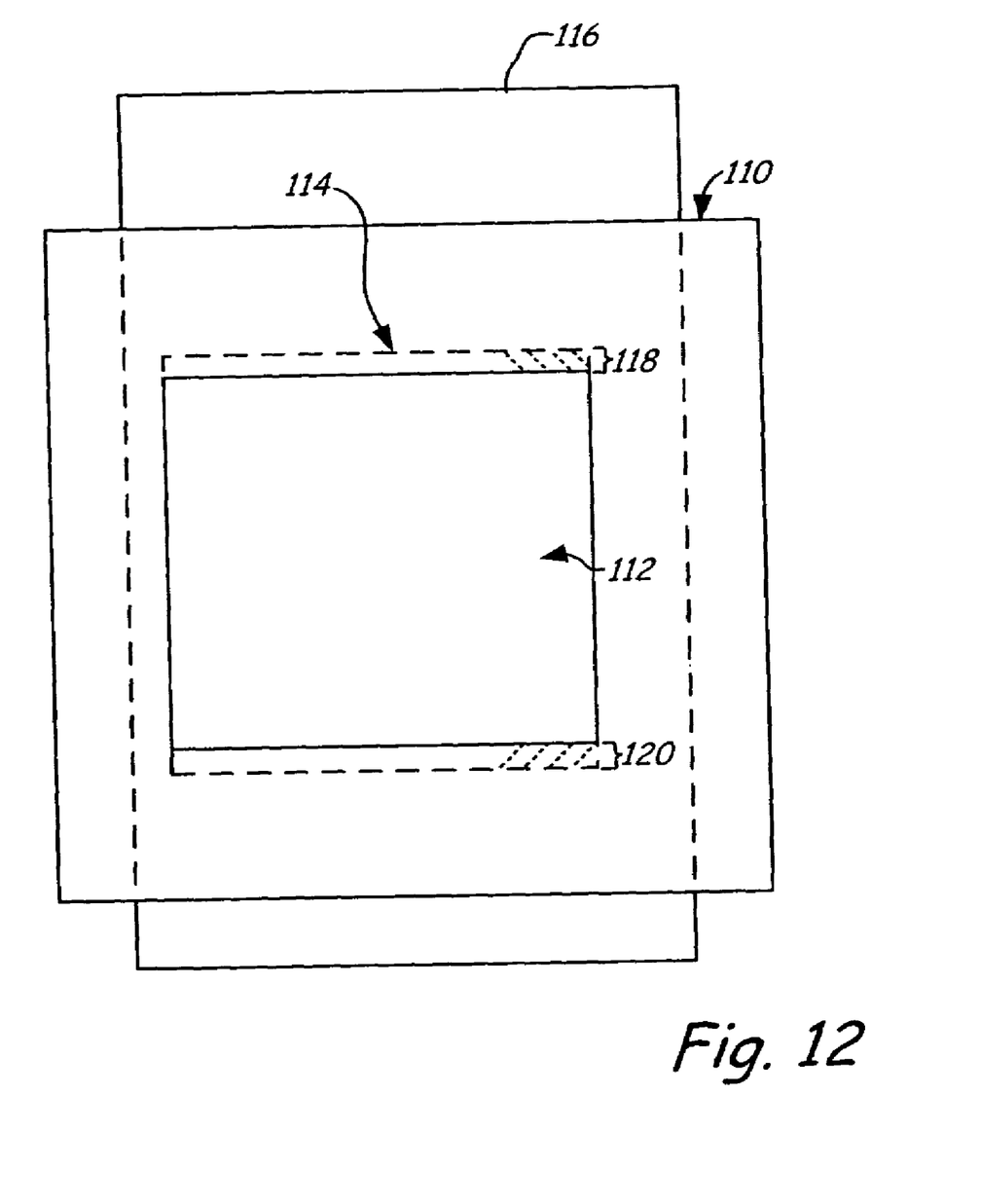
FIG. 12 is an exemplary representation of a mask having a trim mask pattern positioned relative an exposure site of a material blank.

FIG. 12 is an exemplary representation of a mask 110 having a mask pattern 112 positioned relative an exposure site 114 of a material blank 116. When forming a pattern on a material blank, according to the method of the present invention described above, undesired formations, such as formations 118 and 120, may remain within the exposure site 114 after the initial step-and-expose process. For example, undesired formations may be present at or near edges of a desired advanced air bearing surface (AABS) feature in an interior portion of an air bearing surface (ABS) of a slider. Removal of undesired formations may be possible using a trim mask pattern.

A trim mask pattern is a mask pattern of a mask (e.g., a trim mask) that has one or more protective regions that are substantially opaque, for protecting and "covering up" desired features formed on an exposure site of a photoresist layer of a material blank. A trim mask pattern also has one or more substantially transparent regions for fully exposing portions of the photoresist layer of the material blank, thereby trimming away (i.e., eliminating) undesired formations. A trim mask pattern is typically a binary reticle field or binary mask pattern, though other types of trim masks are possible.

The mask pattern 112 can be a trim mask pattern. The mask pattern 112 is included adjacent another mask pattern on a single mask (see, e.g., mask 70 in FIG. 4). Where used as a trim mask pattern, the mask pattern 112 typically includes a large opaque region, as well as regions that are substantially transparent for exposing and trimming away (i.e., eliminating) undesired formations 118 and 120 within the exposure site 114 during one or more trimming exposure events. Exposure of the trim mask pattern 112 generally reduces a total area of raised features on the material blank 116.

EXAMPLE

An exemplary embodiment providing a general overview of the method of the present invention is now provided. An initial step in a photolithography process involves surface preparation, where a surface of a material blank, such as a wafer substrate, is cleaned and dried. The cleaned material blank may be primed, as appropriate.

Next, a photoresist is applied to a surface of the material blank where features will be formed. The photoresist is applied to the material blank at some early stage of the photolithography process, but is typically removed at some later point. A variety of positive and negative photoresist materials are available, and the particular photoresist used is selected according to the particular requirements of a specific application. The photoresist layer is typically applied to the surface of the material blank using a coating apparatus, such as a spin-coating machine, which applies the photoresist in a vacuum.

After the photoresist is applied, a softbake process may be used to promote partial evaporation of photoresist solvents and promote adhesion of the photoresist to the material blank.

Next, after the photoresist is applied and adhered to the material blank (and any softbake processes are conducted), an alignment process is conducted. During alignment, the material blank is precisely aligned relative a mask having at least a first mask pattern. The initial alignment is conducted in X and Y directions as well as rotationally. Positioning of the material blank and the exposure apparatus relative the mask will vary according to the type of exposure apparatus used.

After alignment, a step-and-expose process is conducted according to the method of the present invention. During the exposure process, portions of the photoresist undergo a chemical reaction when illuminated, such as with ultraviolet (UV) light, by the exposure apparatus. Exposure of the first mask pattern causes a pattern to be at least partially imaged on an exposure site. During the exposure process, portions of the photoresist are typically polymerized according to the desired pattern.

Multiple exposure events are initiated for patterning the exposure site of the material blank. For example, each exposure event can be about one-tenth (1/10) of a second. However, the particular length of each exposure event will vary according to characteristics of each particular application.

Between each exposure event, the exposure site of the material blank moves in a lateral direction with respect to the mask. Typically, the material blank moves relative the first mask pattern of the mask a distance less than or equal to a length of the first mask pattern. A direction of lateral movement between each exposure event is typically selected in order to produce optimal results for the particular patterning desired, for example, according to an angle of taper for a three-dimensional feature sought to be formed on a material blank.

During the step-and-expose process, individual exposure events transfer a portion of the total illumination energy required to image a desired pattern on the material blank. When using a halftone mask having an array of halftone mask units, the intensity of illumination energy transmitted through each mask unit is defined according to the following proportional relationship, where "I" is intensity of illumination energy transmitted, "$A_1$" is a total value of the substantially transparent area of the mask unit, and "$A_0$" is a total value of the substantially opaque area of the mask unit:

$$I \propto \left(\frac{A_1}{A_1 + A_0}\right)^2$$

It is assumed in the foregoing proportion that each mask unit in the array has the same overall dimensions, meaning that the value of ($A_1+A_0$) is constant.

The illumination energy of each exposure event in the step-and-expose process can be substantially equal. An illumination energy level of each exposure event is typically less than a total energy required to image a complete pattern on a material blank. For example, seventeen exposure events are used and each exposure event involves about one-seventeenth (1/17) of the total illumination energy. The illumination energy of each exposure event can also vary. The illumination intensity of each exposure event is generally selected according to the pattern desired to be formed.

One or more trimming exposure events are typically conducted after the basic step-and-expose process is completed. A first mask pattern (e.g., a halftone mask pattern) and a second mask pattern (e.g., a trim pattern) can be exposed during a single pass of the exposure apparatus over the material blank. Generally, a single pass is defined as traversing the exposure site with the exposure apparatus only once, as opposed to situations, for example, where the exposure apparatus exposes the material blank on a second occasion using a different mask.

A smoothing event may be used, typically near completion of the step-and-expose and trimming processes. The smoothing event can be a defocus event. The smoothing event can also be a post-bake event.

After the step-and-expose process and any smoothing events are complete, a development process is typically conducted. During the development process, polymerized photoresist can be hardened and unpolymerized photoresist can be removed, through processes such as a postbake process and the application of a stripping solution.

At this point in the overall photolithography process, a three dimensional pattern is typically formed on the photoresist layer of the material blank. This transient three-dimensional pattern on the photoresist layer is not necessarily identical to the pattern desired to be finally formed on the material blank (i.e., the wafer substrate itself). The three-dimensional pattern formed on the photoresist layer is a protective layer of varying depths, with the depth and shape of the three-dimensional pattern on the photoresist varying as a function of the amount of protections desired for particular areas of the material blank.

Next, an etching process is conducted. During the etching process, portions of the material blank itself (i.e., the wafer substrate) are removed. The etching process may be conducted using ion milling with non-reactive charged ions, such as Argon plasma ($Ar^+$), and sometimes along with other chemistry to assist the process. In addition, other techniques known in the art can be utilized. With a technique such as ion milling, the material blank, partially covered by protective photoresist material, is bombarded by ions which erode or sputter away portions of the material blank. During the etching process, depth and shape of portions of the material blank removed will vary as a function of shape and depth of the three-dimensional pattern formed in the photoresist layer. Typically, areas of the material blank not protected (i.e., not covered) by photoresist material will be etched to a greater depth on the material blank. Accordingly, areas of the material blank protected by greater amounts (i.e, a thicker portion) of the photoresist will be etched to lesser depths of the material blank, if at all. During the etching process, the material blank may be rotated in order to achieve optimal results, as will be recognized by those skilled in the art.

After the material blank has been sufficiently etched, an additional step involves removal of any remaining photoresist material.

Although the present invention has been described with reference to preferred embodiments, workers skilled in the art will recognize that changes may be made in form and detail without departing from the spirit and scope of the invention.

The invention claimed is:

1. An exposure method for creating a pattern on an exposure site of a material blank using an exposure apparatus, the method comprising:

provifing a mask having a first mask pattern, wherein the mask comprises an array of mask units configured to define the first mask pattern, wherein each mask unit is a binary halftone mask unit having sub-resolution features therein for defining a transmittance level of the mask unit;

positioning the mask between the exposure apparatus and the material blank;

exposing the exposure site of the material blank; and performing one or more additional exposing steps for patterning the exposure site, wherein between each exposing step the exposure site of the material blank is repositioned in a lateral direction with respect to the mask, and wherein between successive exposing steps involving the first mask pattern there is a relative movement between the mask and the material blank of a distance less than or equal to the length of the first mask pattern.

2. The method of claim 1 and further comprising performing a smoothing event.

3. The method of claim 2 and further comprising performing a defocus event.

4. The method of claim 1 further comprising trimming the pattern on the exposure site of the material blank with a second mask pattern.

5. The method of claim 4 wherein the mask comprises the second mask pattern.

6. The method of claim 5 wherein the exposure apparatus is a stepper and the first mask pattern and the second mask pattern are exposed sequentially during a single stepper pass over the material blank.

7. The method of claim 1 wherein an energy level of each exposing step is approximately equal and less than a total energy required to image the pattern on the material blank.

8. The method of claim 1 wherein alignment of the exposure apparatus remains substantially perpendicular to the material blank.

9. A method of photolithography using a binary halftone mask and an exposure apparatus, the method comprising:

dividing an exposure process into multiple exposure events, wherein the exposure apparatus is positioned perpendicular to a material blank and between successive exposing steps involving the first mask pattern there is a relative movement between the mask and the material blank, for increasing smoothness of a feature formed on the material blank.

10. The method of claim 9 and further comprising performing a smoothing event.

11. The method of claim 10 wherein the smoothing event is a defocus event.

12. The method of claim 10 wherein the smoothing event is a post-bake event.

13. The method of claim 9 wherein the exposure apparatus is a zx stepper, where "z" is an integer.

14. The method of claim 9 wherein an energy level of each exposure event is approximately equal and less than a total energy of the exposure process required to image the pattern on the material blank.

15. An exposure method for creating a pattern on an exposure site of a material blank using an exposure apparatus, the method comprising:

providing a binary halftone mask having a first mask pattern and a second mask pattern;

positioning the binary halftone mask between the exposure apparatus and the material blank;

exposing the exposure site of the material blank using the first mask pattern;

performing a relative lateral movement between the material blank and the binary halftone mask of a distance less than or equal to a length of the first mask pattern after exposing the exposure site of the material blank using the first mask pattern; and smoothing the exposure site of the material blank with another exposure of the first mask pattern.

16. The method of claim 15 further comprising performing a smoothing event.

17. The method of claim 15 further comprising performing a trimming exposure event using the second mask pattern.

18. The method of claim 15 wherein the material blank is moved at least twice.

19. The method of claim 15 wherein the exposure site of the material blank is exposed at least three times using the first mask pattern.

20. A method of trimming undesired features on a material blank, the method comprising:

performing a plurality of exposure events to pattern features in a photoresist layer of the material blank, wherein each exposure event utilizes a binary halftone mask pattern that defines a stepped exposure pattern;

performing a lateral movement between the binary halftone mask pattern and the material blank between successive exposure events;

positioning a binary trim mask pattern relative the patterned material blank; and exposing the binary trim mask pattern;

wherein exposure of the binary trim mask pattern reduces a total area of raised features on the material blank, and wherein exposure of the binary trim mask pattern removes remnants of smoothing exposures of the binary halftone mask pattern located adjacent to patterned features.

21. The method of claim 14, wherein a first of the multiple exposure events forms a stepped profile in the material blank, and wherein a second of the multiple exposure events forms additional steps in the stepped profile formed in the material blank for increasing the smoothness of the stepped profile.

* * * * *

UNITED STATES PATENT AND TRADEMARK OFFICE
CERTIFICATE OF CORRECTION

PATENT NO. : 7,387,871 B2 Page 1 of 1
APPLICATION NO. : 10/927564
DATED : June 17, 2008
INVENTOR(S) : Jianxin Zhu et al.

It is certified that error appears in the above-identified patent and that said Letters Patent is hereby corrected as shown below:

Column 1, Line 22, delete "comers", insert --corners--

Signed and Sealed this

Sixteenth Day of September, 2008

JON W. DUDAS
*Director of the United States Patent and Trademark Office*